(12) United States Patent
Meilhamer et al.

(10) Patent No.: US 9,672,962 B2
(45) Date of Patent: Jun. 6, 2017

(54) BUSHING OF AN ELECTRICAL CONDUCTOR

(75) Inventors: Alfons Meilhamer, Rotthalmuenster (DE); Reinhold Hoenicka, Ortenburg (DE)

(73) Assignee: MICRO-EPSILON Messtechnik GmbH & Co. KG, Ortenburg (DE)

( * ) Notice: Subject to any disclaimer, the term of this patent is extended or adjusted under 35 U.S.C. 154(b) by 542 days.

(21) Appl. No.: 13/641,359

(22) PCT Filed: Mar. 29, 2011

(86) PCT No.: PCT/DE2011/000330
§ 371 (c)(1),
(2), (4) Date: Dec. 11, 2012

(87) PCT Pub. No.: WO2011/127889
PCT Pub. Date: Oct. 20, 2011

(65) Prior Publication Data
US 2013/0075133 A1    Mar. 28, 2013

(30) Foreign Application Priority Data

Apr. 15, 2010   (DE) .................... 20 2010 005 098 U
May 21, 2010   (DE) .................... 20 2010 007 043 U

(51) Int. Cl.
*H01B 17/30*      (2006.01)
*G01D 1/00*       (2006.01)
(Continued)

(52) U.S. Cl.
CPC .............. *H01B 17/30* (2013.01); *G01D 1/00* (2013.01); *G01D 15/00* (2013.01);
(Continued)

(58) Field of Classification Search
CPC .......... H02G 3/22; H02G 3/083; H02G 3/088; H02G 3/046; H02G 15/013; H02G 15/22;
(Continued)

(56) References Cited

U.S. PATENT DOCUMENTS 3,007,130 A * 10/1961 Martin ......................... 439/736
3,025,488 A    3/1962 Barnhart
(Continued)

FOREIGN PATENT DOCUMENTS

DE         963806 C1    5/1957
DE      10117976 A1    8/2002
(Continued)

OTHER PUBLICATIONS

International Searching Authority, International Search Report for International Application No. PCT/DE2011/000330, mailed Jan. 21, 2013, 8 pages, European Patent Office, The Netherlands.
(Continued)

*Primary Examiner* — Timothy Thompson
*Assistant Examiner* — Paresh Paghadal
(74) *Attorney, Agent, or Firm* — Alston & Bird LLP

(57) ABSTRACT

A bushing of an electrical conductor through a wall which separates two regions from one another, wherein the conductor extends through a passage in the wall, at a distance from said wall, characterized in that a sleeve, which is electrically insulated from the passage and is hermetically sealed, preferably extends approximately coaxially through the passage, and in that the electrical conductor extends through the sleeve and is incorporated in the sleeve in a hermetically sealed, preferably integral, manner.

18 Claims, 2 Drawing Sheets

(51) Int. Cl.
*G01D 15/00* (2006.01)
*H02G 15/013* (2006.01)
*H01B 17/34* (2006.01)
*H01B 17/28* (2006.01)
*H02G 15/22* (2006.01)
*H02G 15/26* (2006.01)
*H02G 3/22* (2006.01)
*H02G 3/08* (2006.01)
*H03K 17/95* (2006.01)

(52) U.S. Cl.
CPC ........... *H02G 15/013* (2013.01); *H01B 17/28* (2013.01); *H01B 17/34* (2013.01); *H02G 3/083* (2013.01); *H02G 3/088* (2013.01); *H02G 3/22* (2013.01); *H02G 15/22* (2013.01); *H02G 15/26* (2013.01); *H03K 17/9502* (2013.01); *H03K 17/952* (2013.01)

(58) Field of Classification Search
CPC ...... H02G 15/26; H02G 3/065; H02G 3/0675; H02G 3/0683; H02G 3/691; H01B 17/60; H01B 17/305; H01B 17/14; H01B 17/26; H01B 17/28; H01B 17/34; H01B 17/303; H01B 17/306; B60R 16/0222
USPC ...................................... 174/152 G, 152 GM
See application file for complete search history.

(56) References Cited

U.S. PATENT DOCUMENTS

| | | | | |
|---|---|---|---|---|
| 3,331,913 A | * | 7/1967 | Johnson | 174/539 |
| 3,473,110 A | * | 10/1969 | Hardin et al. | 324/236 |
| 3,988,053 A | * | 10/1976 | Dodenhoff | 439/887 |
| 4,029,897 A | | 6/1977 | Mayer et al. | |
| 4,841,101 A | | 6/1989 | Pollock | |
| 5,406,444 A | * | 4/1995 | Selfried | H01B 17/28 174/152 GM |
| 5,712,562 A | * | 1/1998 | Berg | G01B 7/001 174/528 |
| 7,081,012 B2 | | 7/2006 | Gensert et al. | |
| 7,511,482 B2 | * | 3/2009 | Teichmann et al. | 324/207.26 |
| 7,966,070 B2 | * | 6/2011 | Taylor | A61N 1/3754 607/36 |
| 2006/0282126 A1 | * | 12/2006 | Fischbach | A61N 1/3754 607/37 |
| 2009/0223699 A1 | * | 9/2009 | Bernauer | 174/152 GM |
| 2010/0219737 A1 | * | 9/2010 | Werner et al. | 313/243 |
| 2010/0264939 A1 | * | 10/2010 | Mahler | G01D 11/245 324/654 |
| 2011/0186349 A1 | * | 8/2011 | Troetzschel | B28B 11/24 174/650 |
| 2013/0021029 A1 | * | 1/2013 | Hoenicka et al. | 324/258 |

FOREIGN PATENT DOCUMENTS

| | | | | |
|---|---|---|---|---|
| FR | 868638 A | | 1/1942 | |
| FR | 1474348 A | * | 3/1966 | C03C 27/04 |
| FR | 1474348 A | | 3/1967 | |
| GB | 2248526 A | * | 4/1992 | |
| WO | WO 2007/098315 A1 | | 8/2007 | |

OTHER PUBLICATIONS

The International Bureau of WIPO, International Preliminary Report on Patentability including Written Opinion of the International Searching Authority (Translation) for International Application No. PCT/DE2011/000330, issued Apr. 2, 2013, 6 pages, Switzerland.

* cited by examiner

BUSHING OF AN ELECTRICAL CONDUCTOR

CROSS REFERENCE TO RELATED APPLICATIONS

This application is a national stage application, filed under 35 U.S.C. §371, of International Application No. PCT/DE2011/000330, filed Mar. 29, 2011, and claims priority to the same, which is hereby incorporated by reference in its entirety. This application also claims priority to German Application No. 20 2010 005 098.7, filed Apr. 15, 2010, and German Application No. 20 2010 007 043.0, filed May 21, 2010, both of which are hereby incorporated by reference in their entirety.

BACKGROUND

Related Field

The invention relates to a bushing of an electrical conductor through a wall which separates two regions from one another, wherein the conductor extends through a passage in the wall, at a distance from said wall.

It should be introductorily noted that the invention relates to any bushing, whereas here it is a matter of a bushing through a wall which separates two regions from one another. From experience, hermetically-sealed glass-metal bushings are known. Bushings of this type are used, for example, in places where electrical signals or electrical energy are fed via contacts through a partition, wherein the partition separates two regions from one another. The partition is understood in the broadest sense as a wall, barrier, boundary, or the like.

A wall or partition of this type generally serves to delimit the regions in question from one another in such a manner that any media, fields, or temperatures cannot arrive directly from the first region into the second region. As an example, the separation of two regions with respect to gases can be cited, wherein in this case in particular the separation of regions with different pressures or vacuum with respect to atmospheric pressure is of interest. The same applies for liquids, for solids (for example, dust, powder, granulate, bulk solids of any type, etc.), for electrical or magnetic fields, for temperatures, etc.

In each case, the feed-through of electrical signals or electrical energy through a partition requires a very particular sealing of the bushing, namely in order to prevent undesired exchange of the media between the two regions.

If the wall is an electrical conductor, further requirements are placed on the bushing; namely, the bushing must be electrically insulated from the wall. Various possibilities for this purpose are known from experience, for example, molding or gluing, or press-in seals made of elastic materials such as rubber, etc.

Metal contact pins are often used as electrical conductors for feed-through through the wall, which pins extend through the wall and are sealed in an insulating way against the wall. Contact pins of this type can be pressed into plastic or molded into a metal bushing by a moldable plastic, for example by epoxy resin.

If the bushing should be hermetically sealed, such that, for example, no exchange of gases can occur between the two regions, this puts high requirements on the insulation. In cases of this type, the bushing must be pressure tight, or there can be additional requirements that aggressive media be effectively separated from one another.

Glass-metal bushings are already known from years of experience; in said glass-metal bushings, the electrical contacts are simultaneously fixed and sealed by a glass melt in a passage arranged in the wall. In the production thereof, glass is softened under high temperatures in such a way that it is pourable and thereby the space between the contact pin and the partition can be filled. A sufficiently good seal is created after cooling.

With regard to the bushings or seals known from experience, one distinguishes between so-called "matched" seals and "unmatched" seals. With regard to matched seals, materials are used having thermal expansion coefficients that do not differ from one another, or differ only slightly. This leads to the fact that, after cooling, the glass-metal seal has no, or hardly any, internal tensions. The fixing and sealing takes place in this case by adhesion in the interface between metal and glass. Care should be taken that the respective interfacial energies allow a sufficient adhesion. If necessary, it is required to treat the metal surfaces in relation to the surface tension/interfacial energy, for example by coating.

With regard to unmatched seals, different thermal expansion coefficients of the materials are present. This leads to the fact that, in addition to pure adhesion, an inner tension of the connection to the seal can be used, wherein care should be taken that the materials used can withstand the tensions that occur.

Glass-metal bushings are on the market in the most widely varied embodiments. In general, contact pins are used that are arranged or fixed in a metal housing by a glass insulation. This can thereby be a bushing with a metal flange which is mounted in the partition by welding, screwing, O-ring seals, or taking other suitable methods as a basis. The contact points are routinely functionally configured; they can, for example, be the contacts of a plug. The further contacting then takes place using an appropriate socket.

It is also conceivable to provide contacts that use soldering or welding, to which then a continuing conductor, for example, a stranded cable or another connecting wire, can be applied by soldering or welding. Likewise, contact pins are known from experience on or to which pins a conductor is crimped.

Description of Related Art

Regarding the relevant prior art, reference is made to DE 963 806 A, from which a vacuum-tight fusing for current feedthroughs in discharge tubes is known. The partition provided there consists at least partially of metal, wherein the electrical connector is connected directly to a bushing or sleeve-shaped metal body by the insertion of glass.

A hermetic glass seal, viewed separately between electrically conductive components using special sealing structures, is known from U.S. Pat. No. 4,029,897. Reference is further made to U.S. Pat. No. 4,841,101 as well as DE 101 17 976 A1.

The previously known prior art is problematic in several respects. Regarding this, the following points:

The contacts for bushings must, in the case of matched seals, be produced from a material that is sufficiently well suited based on the thermal expansion coefficient thereof. Materials of this type can generally not be soldered, or can be soldered only poorly. This often relates to titanium, tungsten, molybdenum, or ferric compounds. Materials of this type can be connected by soldering to conventional conductors only after previous treatment of the surface, for example, by application of a thin contact layer of gold or silver.

The use of conventional contact pins usually requires a considerable installation space for the bushing through the respective wall. Particularly when using mating plugs, the installation space is once again extended to a considerable extent, because mating plugs are elongated components with considerable dimensions.

A considerable installation space is also required for solder or weld connections, because the solder or weld points usually lie outside the bushing.

In addition, it is disadvantageous in the case of known solder and weld connections that these can break due to mechanical loads, for example, due to shock or vibration, or due to tensile or pressure loads. In this respect, it is necessary to generate a mechanical fixing of the contact points or a strain relief for the conductor, by which means the installation is once again enlarged, in particular the respective component is extended.

A further disadvantage of the bushings known from experience can be seen in that the contacts are separately contacted on both sides of the known bushing. In this respect, the susceptibility to errors is increased based on the series connection of at least two connections of different or identical connection technologies. The plug connections known from experience are additionally susceptible to error and expensive, because the security of the contacts at plugging in can only be permanently assured by special design measures.

When using different materials for the contact pins and the electrical conductor, there is the additional danger that thermovoltages are induced based on the Seebeck effect, which thermovoltages in turn influence electrical signals.

Finally, when using different materials, it is disadvantageous that these tend toward corrosion due to the electrochemical series. Contact resistance occurs. In addition, there is a danger that the seal could be destroyed.

BRIEF SUMMARY

It is therefore the object of the present invention to specify a bushing of an electrical conductor through a wall which separates two regions from one another, in which the previously described disadvantages are eliminated or at least very considerably reduced. The bushing shall have a design length that is as short as possible, wherein a hermetic seal on the one hand and a good electrical contacting on the other hand must be guaranteed. At sufficient mechanical stability, the bushing shall be simple in design and inexpensive to produce.

The preceding object is solved by the features of the claims. According to this, the generic bushing is characterized in that a sleeve, which is electrically insulated from the passage and is hermetically sealed, extends approximately coaxially through the passage, and in that the electrical conductor extends through the sleeve and is incorporated in the sleeve in a hermetically sealed, integral, manner.

It was recognized in an advantageous way that the bushing of an electrical conductor through a wall separating two regions can be very easily realized in that the passage required for the bushing is provided with a sleeve that is sealed with respect to the wall. Basically, while the sleeve around a component can be any material, an advantageous material selection will be discussed later.

Basically, it is unimportant how the sleeve extends through the passage and thus through the wall. If the sleeve material used is supposed to be an insulator, the seal between the sleeve and the wall would be designed merely with regard to a hermetic seal. If the sleeve is an electrically conductive material, it is necessary that the sleeve is electrically insulated in the passage with respect to the material of the wall. A hermetically sealing effect is additionally necessary.

The electrical conductor extends through the sleeve, likewise specifically sealing, wherein an integral incorporation of the electrical conductor is provided in the sleeve. In other words, the electrical conductor can be integrally incorporated in the sleeve, the sleeve being incorporated in the passage of the wall, namely electrically insulated with respect to the wall, and with a hermetically sealing effect between the sleeve and the wall.

The provision of the sleeve and the double incorporation—on the one hand of the electrical conductor in the sleeve and on the other of the sleeve in the passage—create with simple means an effective bushing through a wall that separates the different regions from one another. In an advantageous way, the sealing of the sleeve with respect to the passage is designed as sealing means, for example, out of plastic. It is likewise conceivable that the seal is designed in the form of vitrification, as it is already known in itself from the prior art. Thus the seals can be designed hermetically tight, specifically with an effect between the previously cited sleeve and the material of the wall.

The sleeve can consist of the most different materials, for example of metal. The sleeve can be an electrically conductive material. Advantageously, the sleeve consists of the same material or a similar material as the electrical conductor.

The sleeve can be produced, for example, from an iron-nickel alloy.

With respect to the seal of the sleeve with respect to the wall, it is conceivable that the material of the seal has approximately the same thermal expansion as the sleeve. Tensions in the bushing are prevented due to these measures. In a more particularly advantageous embodiment, the seal of the sleeve with respect to the wall has a lower thermal expansion than the material of the wall. An embodiment of this type has an enormous advantage if the wall at least partially surrounds the seal and if the wall is properly shrunk on the seal during cooling, due to the greater shrinkage. Due to the external tensions thus occurring on the seal—produced, for example, from glass—there results a higher pressure resistance of the seal, which again increases the application range.

The electrical conductor can be designed as stranded wire, for example, copper stranded wire. Any other electrical conductors can be realized under consideration of a suitable material matching of the materials involved in the bushing.

In an advantageous way, the electrical conductor is incorporated in the sleeve, for example across the entire length thereof, by soft or hard soldering. This has the advantage that an inner contacting of the electrical conductor to a conductive sleeve is realized, at which sleeve further contactings—on the connection side—are possible in turn.

In a particularly advantageous way, the wall is a part of a housing of a sensor, for example an inductive position sensor. The electrical conductor is thereby for example the coil wire of the sensor, it being a matter of the electrical contacting between the coil or coils and a connecting cable. The connecting wire is soldered to the connection-side end of the sleeve, to this and/or to the electrical conductor, or to the coil wire. The realization of plug connections or other electrical connections remains unlimited.

In order to effect a more far-reaching stability, it is advantageous if the connection-side region in the sensor housing is filled with a sealing compound which surrounds the contacting of the electrical conductor or of the sleeve and the connecting cable. Due to these measures, a more far-reaching seal is achieved on the one hand, and a mechanical stability on the other.

The inventive bushing is advantageous in comparison to the proven, documented prior art, where, within the context of the inventive specification, a very particular meaning is assigned to the sleeve as a hollow, tubular contact. Said sleeve is fixed in a passage of the wall by an insulating material, with the electrical conductor extending through the sleeve. An integral connection, for example by soldering, fixes the electrical conductor in the sleeve, which is again set in the passage of the wall.

As has already been mentioned, a sealing means or a vitrification is provided between the sleeve and the passage of the wall, wherein the sealing means can be an epoxy resin.

A vitrification brings along the enormous advantage that by this means a vacuum seal of up to $10^{-9}$ mbar*l/s can be realized at a pressure differential of 1 bar. Finally, a hermetic seal can be generated by the vitrification.

Since the sleeve can consist of the same material as the electrical conductor, the electrical conductor can be connected to the sleeve in a superb way, namely by being fed through the sleeve and integrally connected in the interior of the sleeve by soft or hard soldering with the interior of the sleeve. With respect to a suitable selection of materials and dimensioning of the electrical conductor and sleeve, it is conceivable that the solder is positively drawn into the sleeve during soldering and the sleeve is completely filled in the interior, namely due to the capillary effect occurring there.

It is achieved in an inventive way that the contacting, in this case the solder point, and thus with the actual contact point, is located not outside of the sleeve but rather inside the sleeve. Consequently, the contact point within the sleeve is protected sufficiently well and lies primarily inside the hermetically sealed or sealed region. This is also enormously advantageous.

In an inventive way, the bushing can be constructed compactly or short, by which means the most different applications result. This applies for example in medical technology in implanted devices, in sensor technology with regard to miniaturized sensors, and also in aerospace technology, where compact and particularly light-weight components are required. A conclusive list of the application possibilities is not possible due to the multiplicity of uses.

At this point, let it be emphasized once more very particularly that the solder within the sleeve produces an electrical contact, a mechanical connection, and beyond that a hermetic seal. A strain relief is also achieved by the contact point. In addition, a simple molding of the conductor within the sleeve is possible without additional design measures.

Enormous advantages result from the inventive bushing, in particular in respect of a permanently sealed vacuum bushing at high vacuum. Reliable pressure bushings can be realized, above all also bushings for aggressive media in one of the respective regions. Bushings in devices to be implanted, for example in artificial pacemakers in medical technology, can be realized.

Advantages arise in sensor technology in particular with respect to sealing and temperature resistant sensors in difficult environmental conditions.

Sensors and actuators for aerospace technology can be correspondingly equipped. Corresponding bushings can be realized in semiconductor technology as well, for example, in the case of an ultra-clean vacuum in machines for producing semiconductors.

Hermetic sealing at $10^{-9}$ mbar*l/s [delta p=1 bar] can be realized, wherein only a one-sided contacting is necessary. The single contact point lies in the protected, hermetically sealed region. From this arises simultaneously a compact design in the outer region, wherein this has a particular relevance for sensor and medical technology. A strain relief of the electrical conductor or of the cable is realized in an inventive way.

There are now various possibilities for designing and developing the teaching of the present invention in an advantageous way. Reference is therefore made on the one hand to the claims subordinate to the broadest claim, and on the other hand to the subsequent explanation of exemplary embodiments of the invention by the drawings. In connection with the explanation of the exemplary inventive embodiments by the drawings, in general, exemplary embodiments and developments of the teaching are also explained.

DETAILED DESCRIPTION OF THE VARIOUS EMBODIMENTS

Figure 1:
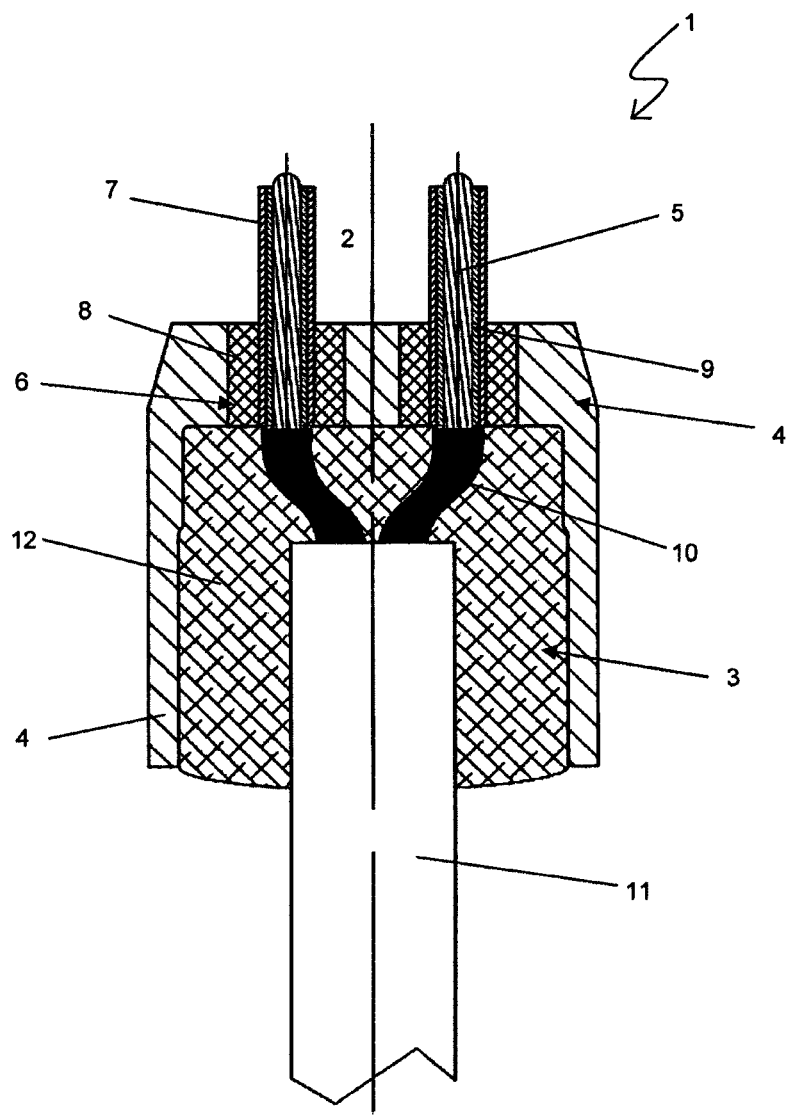
FIG. 1 shows, in a schematic view, partially cut away, a first embodiment of an inventive bushing

FIG. 1 shows, in a schematic view, partially cut away, a particular embodiment of an inventive bushing 1, wherein this is arranged in a wall 4 that separates two regions 2, 3 from one another, namely said bushing 1 is fed through the wall 4.

Stated more exactly, a sleeve 7 made of electrically conductive material extends through a passage 6 in the wall 4, wherein the sleeve 7 is arranged hermetically sealed and electrically insulated with respect to the wall 4. The insulation between the sleeve 7 and the wall 4 is a vitrification 8.

The vitrification 8 functions between the wall 4 and the sleeve 7. Due to the vitrification 8, the sleeve 7 is securely positioned and electrically sealed with respect to the material of the wall 4.

The electrical conductor 5 extends within the sleeve 7, wherein said conductor is integrally connected in the sleeve 7 with the interior wall of sleeve 7, namely by means of hard or soft solder 9. Thus, an inner contacting of the electrical conductor 5 is realized within the sleeve 7. The electrical conductor 5 can be a stranded cable as a component of the connecting cable 11. At this point, it should be noted that the electrical conductor can also be the so-called pins or connecting wires of electrical/electronic components, for example the connecting wires of diodes, resistors, or other functional elements.

On the connection side, the stranded wire 5 of the cable core 10 is connected using solder with the sleeve 7. The connection-side region is sealed by a sealing compound 12, by which means an additional seal with simultaneous mechanical stabilization results. Simultaneously, a strain relief in respect of the connecting cable is realized, while, moreover, the contact point is protected with respect to environmental influences.

Figure 2:
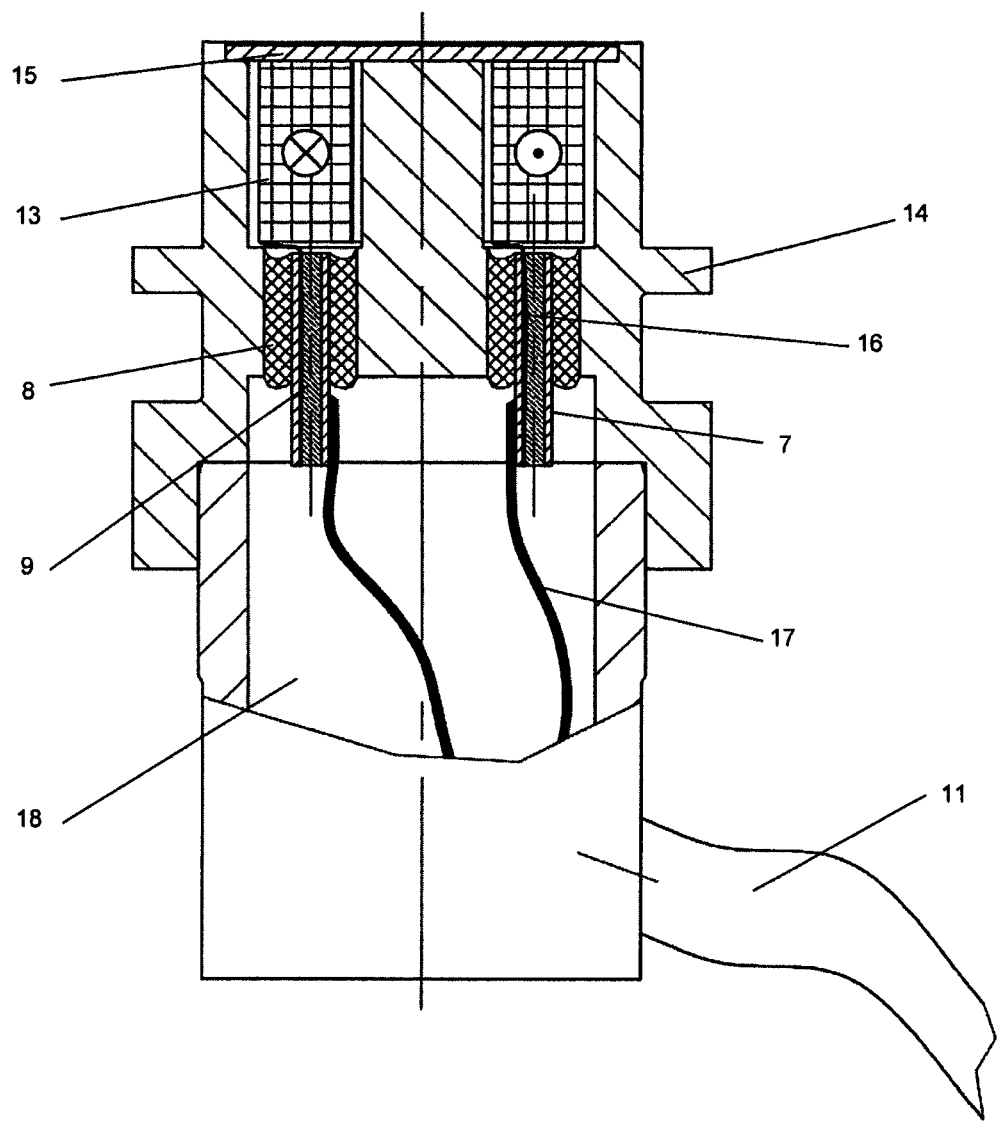
FIG. 2 shows, in a schematic view, a second embodiment of an inventive bushing in an inductive position sensor.

FIG. 2 shows a further embodiment of an inventive bushing 1 using the example of an inductive position sensor.

The contacting is produced between the coil 13 and the connecting cable 11 by means of an inventive bushing 1.

The sensor housing 14 represents the wall between the regions and consists of metal, for example, stainless steel. It includes the coil 13.

The coil 13 is protected on the end face with a protective cover 15 against the environment.

The coil wire 16 is fed through the sleeve 7 and solder connected there to the interior of the sleeve 7 by means of soft solder 9.

At the opposite end, the connecting stranded wire 17 of the connecting cable 11 is soldered from outside to the sleeve 7.

The rear region within the sensor housing 14 is filled with sealing compound 18, which surrounds on the one hand the rear region of the sleeve 7 and on the other hand the connecting stranded wire 17 in addition to the contact region. The advantage of this embodiment can be seen in that an extremely short, compact design of the bushing and thus of the sensor is possible. Simultaneously, the coil 13 can be protected with respect to media that could penetrate into the sensor based on a de facto steadily weakening seal at the cable sheath on the rear side of the sensor.

Preceding embodiments make it clear that the sensor is sufficiently well-sealed in light of the preceding embodiments on the measuring side as well as on the connecting side, namely by using the inventive bushing with the sealing and contacting measures provided there.

It was recognized in an advantageous way that the bushing of an electrical conductor through a wall separating two regions can be very easily realized in that the passage required for the bushing is provided with a sleeve that is sealed with respect to the wall. Basically, while the sleeve around a component can be any material, an advantageous material selection will be discussed later.

Basically, it is unimportant how the sleeve extends through the passage and thus through the wall. If the sleeve material used is supposed to be an insulator, the seal between the sleeve and the wall would be designed merely with regard to a hermetic seal. If the sleeve is an electrically conductive material, it is necessary that the sleeve is electrically insulated in the passage with respect to the material of the wall. A hermetically sealing effect is additionally necessary.

The electrical conductor extends through the sleeve, likewise specifically sealing, wherein an integral incorporation of the electrical conductor is provided in the sleeve. In other words, the electrical conductor can be integrally incorporated in the sleeve, the sleeve being incorporated in the passage of the wall, namely electrically insulated with respect to the wall, and with a hermetically sealing effect between the sleeve and the wall.

The provision of the sleeve and the double incorporation—on the one hand of the electrical conductor in the sleeve and on the other of the sleeve in the passage—create with simple means an effective bushing through a wall that separates the different regions from one another. In an advantageous way, the sealing of the sleeve with respect to the passage is designed as sealing means, for example, out of plastic. It is likewise conceivable that the seal is designed in the form of vitrification, as it is already known in itself from the prior art. Thus the seals can be designed hermetically tight, specifically with an effect between the previously cited sleeve and the material of the wall.

The sleeve can consist of the most different materials, for example of metal. The sleeve can be an electrically conductive material. Advantageously, the sleeve consists of the same material or a similar material as the electrical conductor.

The sleeve can be produced, for example, from an iron-nickel alloy.

With respect to the seal of the sleeve with respect to the wall, it is conceivable that the material of the seal has approximately the same thermal expansion as the sleeve. Tensions in the bushing are prevented due to these measures. In a more particularly advantageous embodiment, the seal of the sleeve with respect to the wall has a lower thermal expansion than the material of the wall. An embodiment of this type has an enormous advantage if the wall at least partially surrounds the seal and if the wall is properly shrunk on the seal during cooling, due to the greater shrinkage. Due to the external tensions thus occurring on the seal—produced, for example, from glass—there results a higher pressure resistance of the seal, which again increases the application range.

The electrical conductor can be designed as stranded wire, for example, copper stranded wire. Any other electrical conductors can be realized under consideration of a suitable material matching of the materials involved in the bushing.

In an advantageous way, the electrical conductor is incorporated in the sleeve, for example across the entire length thereof, by soft or hard soldering. This has the advantage that an inner contacting of the electrical conductor to a conductive sleeve is realized, at which sleeve further contactings—on the connection side—are possible in turn.

In a particularly advantageous way, the wall is a part of a housing of a sensor, for example an inductive position sensor. The electrical conductor is thereby for example the coil wire of the sensor, it being a matter of the electrical contacting between the coil or coils and a connecting cable. The connecting wire is soldered to the connection-side end of the sleeve, to this and/or to the electrical conductor, or to the coil wire. The realization of plug connections or other electrical connections remains unlimited.

In order to effect a more far-reaching stability, it is advantageous if the connection-side region in the sensor housing is filled with a sealing compound which surrounds the contacting of the electrical conductor or of the sleeve and the connecting cable. Due to these measures, a more far-reaching seal is achieved on the one hand, and a mechanical stability on the other.

The inventive bushing is advantageous in comparison to the proven, documented prior art, where, within the context of the inventive specification, a very particular meaning is assigned to the sleeve as a hollow, tubular contact. Said sleeve is fixed in a passage of the wall by means of an insulating material, with the electrical conductor extending through the sleeve. An integral connection, for example by means of soldering, fixes the electrical conductor in the sleeve, which is again set in the passage of the wall.

As has already been mentioned, a sealing means or a vitrification is provided between the sleeve and the passage of the wall, wherein the sealing means can be an epoxy resin.

A vitrification brings along the enormous advantage that by this means a vacuum seal of up to $10^{-9}$ mbar*l/s can be realized at a pressure differential of 1 bar. Finally, a hermetic seal can be generated by the vitrification.

Since the sleeve can consist of the same material as the electrical conductor, the electrical conductor can be connected to the sleeve in a superb way, namely by being fed through the sleeve and integrally connected in the interior of the sleeve by soft or hard soldering with the interior of the sleeve. With respect to a suitable selection of materials and dimensioning of the electrical conductor and sleeve, it is conceivable that the solder is positively drawn into the sleeve during soldering and the sleeve is completely filled in the interior, namely due to the capillary effect occurring there.

It is achieved in an inventive way that the contacting, in this case the solder point, and thus with the actual contact point, is located not outside of the sleeve but rather inside the sleeve. Consequently, the contact point within the sleeve is protected sufficiently well and lies primarily inside the hermetically sealed or sealed region. This is also enormously advantageous.

In an inventive way, the bushing can be constructed compactly or short, by which means the most different applications result. This applies for example in medical technology in implanted devices, in sensor technology with regard to miniaturized sensors, and also in aerospace technology, where compact and particularly light-weight components are required. A conclusive list of the application possibilities is not possible due to the multiplicity of uses.

At this point, let it be emphasized once more very particularly that the solder within the sleeve produces an electrical contact, a mechanical connection, and beyond that a hermetic seal. A strain relief is also achieved by the contact point. In addition, a simple molding of the conductor within the sleeve is possible without additional design measures.

Enormous advantages result from the inventive bushing, in particular in respect of a permanently sealed vacuum bushing at high vacuum. Reliable pressure bushings can be realized, above all also bushings for aggressive media in one of the respective regions. Bushings in devices to be implanted, for example in artificial pacemakers in medical technology, can be realized.

Advantages arise in sensor technology in particular with respect to sealing and temperature resistant sensors in difficult environmental conditions.

Sensors and actuators for aerospace technology can be correspondingly equipped. Corresponding bushings can be realized in semiconductor technology as well, for example, in the case of an ultra-clean vacuum in machines for producing semiconductors.

Hermetic sealing at $10^{-9}$ mbar*l/s [delta p=1 bar] can be realized, wherein only a one-sided contacting is necessary. The single contact point lies in the protected, hermetically sealed region. From this arises simultaneously a compact design in the outer region, wherein this has a particular relevance for sensor and medical technology. A strain relief of the electrical conductor or of the cable is realized in an inventive way.

In view of further advantageous embodiments of the inventive bushing, reference is made to the general part of the description as well as to the claims included to avoid repetitions.

Finally, reference is explicitly made to the fact that the previously described embodiments of the inventive bushing serve merely as an argument of the claimed teaching; however, they are not limited to the embodiments.

LIST OF REFERENCES

1 Bushing
2 Region
3 Region
4 Wall
5 Electrical conductor
6 Passage
7 Sleeve
8 Vitrification
9 Hard/Soft solder
10 Cable core
11 Connecting cable
12 Sealing compound
13 Coil
14 Sensor housing
15 Protective cover
16 Coil wire
17 Connecting stranded wire
18 Sealing compound

The invention claimed is:

1. Bushing of an electrical conductor through a wall which separates two regions from one another, wherein:
   the conductor extends through a passage in the wall, at a distance from said wall;
   a sleeve, which is electrically insulated from the passage and is hermetically sealed, extends approximately coaxially through the passage; and
   the electrical conductor extends through the sleeve and is incorporated in the sleeve in a hermetically sealed manner,
   wherein the electrical conductor is integrally connected with an interior wall of the sleeve, over an entire length of the electrical conductor, by at least one of soft or hard soldering.

2. Bushing according to claim 1, wherein the electrical conductor is incorporated in the sleeve in an integral manner.

3. Bushing according to claim 1, wherein a seal of the sleeve with respect to the passage is a sealing compound.

4. Bushing according to claim 3, wherein the sealing compound is a plastic material.

5. Bushing according to claim 3, wherein the sealing compound is formed of a glass material.

6. Bushing according to claim 1, wherein the sleeve is formed of a metal material.

7. Bushing according to claim 6, wherein the metal material of the sleeve is the same metal material as that of the electrical conductor.

8. Bushing according to claim 1, wherein the sleeve is produced from an iron-nickel alloy.

9. Bushing according to claim 1, wherein the seal of the sleeve with respect to the wall has approximately the same thermal expansion as the sleeve.

10. Bushing according to claim 1, wherein the seal of the sleeve with respect to the wall has a lower thermal expansion than the material of the wall.

11. Bushing according to claim 1, wherein the electrical conductor is designed as stranded wire.

12. Bushing according to claim 1, wherein the electrical conductor is designed as copper stranded wire.

13. Bushing according to claim 1, wherein the electrical conductor is incorporated in the sleeve by at least one of soft and hard soldering.

14. Bushing according to claim 1, wherein the wall is part of a housing of a sensor and the electrical conductor is a coil wire of the sensor and serves for electrical contacting between coil(s) and the connecting cable, wherein the connecting cable is soldered to at least one of: a connection-side end of the sleeve, the electrical conductor, or the coil wire.

15. Bushing according to claim 14, wherein the sensor is an inductive position sensor.

16. Bushing according to claim 1, wherein, in a connection-side region, a sealing compound is provided, the sealing compound at least partially filling at least a sensor housing, wherein the sealing compound surrounds any functional elements and thereby seals and stabilizes the bushing.

17. Bushing according to claim 16, wherein the sealing compound is provided in the sensor housing.

18. Bushing according to claim 16, wherein the sealing compound surrounds at least one of the contacting of the electrical conductor and the connecting cable, or the sleeve and the connecting cable.

* * * * *